United States Patent
Maheshwari et al.

(10) Patent No.: US 7,750,711 B2
(45) Date of Patent: Jul. 6, 2010

(54) PHASE SELECT CIRCUIT WITH REDUCED HYSTERESIS EFFECT

(75) Inventors: Sanjeev Maheshwari, San Jose, CA (US); Meei-Ling Chiang, Saratoga, CA (US); Emerson S. Fang, Fremont, CA (US)

(73) Assignee: Globalfoundries Inc., Grand Cayman (KY)

( * ) Notice: Subject to any disclaimer, the term of this patent is extended or adjusted under 35 U.S.C. 154(b) by 566 days.

(21) Appl. No.: 11/742,860

(22) Filed: May 1, 2007

(65) Prior Publication Data
US 2008/0273528 A1     Nov. 6, 2008

(51) Int. Cl.
*H03H 11/26* (2006.01)
(52) U.S. Cl. ............................... 327/276; 327/278
(58) Field of Classification Search .......... 327/170, 327/175, 261, 263, 264, 276–278, 285, 288, 327/290
See application file for complete search history.

(56) References Cited

U.S. PATENT DOCUMENTS 5,592,104 A * 1/1997 Bach ........................ 326/27
6,246,259 B1 * 6/2001 Zaliznyak et al. ............ 326/41
6,803,799 B1 * 10/2004 Churchill et al. ............ 327/202

OTHER PUBLICATIONS

Bernstein, Kerry, "SOI Circuit Design Considerations," EECS VLSI Seminar Series Power Point presentation, 35 slides, retrieved from URL: http://www.eecs.umich.edu/vlsi_seminar/w02/slides/bernstein_talk.pdf, University of Michigan, 6 pages, Apr. 1, 2002.
Lundstrom, Mark, "EE-612: Lecture 28: Overview of SOI Technology," Purdue University Power Point presentation, 47 slides, retrieved from URL: www.nanohub.org, 8 pages, Nov. 30, 2006.

* cited by examiner

*Primary Examiner*—An T Luu
(74) *Attorney, Agent, or Firm*—Zagorin O'Brien Graham LLP

(57) ABSTRACT

A phase signal select circuit includes a supporting path coupled to a tri-state inverter circuit. The supporting path reduces effects of hysteresis on signal transfer. An apparatus includes at least one input node responsive to a respective one of at least one input signal. The apparatus includes at least one circuit coupled to a respective one of the at least one input node and coupled to an output node. Individual ones of the at least one circuit are configured to provide a version of the respective input signal to the output node in response to a first state of a respective select signal. The apparatus includes at least one second circuit coupled to a respective one of the at least one circuit. The at least one second circuit is configured to toggle nodes of the at least one circuit in response to a second state of the respective select signal.

23 Claims, 7 Drawing Sheets

US 7,750,711 B2

PHASE SELECT CIRCUIT WITH REDUCED HYSTERESIS EFFECT

BACKGROUND

1. Field of the Invention

This application is related to integrated circuits and more particularly to data communications links between integrated circuits.

2. Description of the Related Art

To properly recover data received by an integrated circuit node and transmitted across a data communications link by another integrated circuit node, the receiving node must sample the data during an appropriate phase of the data signal. A transmitting node compliant with an exemplary communications link may transmit, on a separate signal line, a reference clock signal for use in sampling commands, addresses or data (hereinafter, "data") by the receiving node. However, introduction of skew between a received data signal and a received sample clock signal (e.g., skew introduced by the channel of the communications link, the receiver, or other sources) may compromise data recovery. For example, if skew between the reference clock signal and the received data signal causes data transitions to approach the sampling point, the data transitions may fall within the clock signal setup time of a sampling device (e.g., flip-flop or other state element) causing errors in data recovery. In addition, the phase relationship between the received clock signal and the received data signal may not be stationary, which adds complexity to clock and data recovery operations.

SUMMARY

A phase signal select circuit, which may be used in phase interpolation in a receiver interface implemented in silicon-on-insulator technology, includes a supporting path coupled to a tri-state inverter circuit. The supporting path reduces effects of hysteresis on signal transfer by the phase signal select circuit. In at least one embodiment of the invention, an apparatus includes at least one input node responsive to a respective one of at least one input signal. The apparatus includes at least one circuit coupled to a respective one of the at least one input node and coupled to an output node. Individual ones of the at least one circuit are configured to provide a version of the respective input signal to the output node in response to a first state of a respective select signal. The apparatus includes at least one second circuit coupled to a respective one of the at least one circuit. The at least one second circuit is configured to toggle nodes of the at least one circuit in response to a second state of the respective select signal.

In at least one embodiment of the invention, a method includes effectively enabling a first path to provide to an output node, a version of an input clock signal in response to a first state of at least one select signal and effectively disabling the first path otherwise. The method includes effectively enabling a second path to toggle at least one intermediate node within the first path while the first path is effectively disabled, and effectively disabling the second path otherwise. The second path is responsive to the version of the input clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
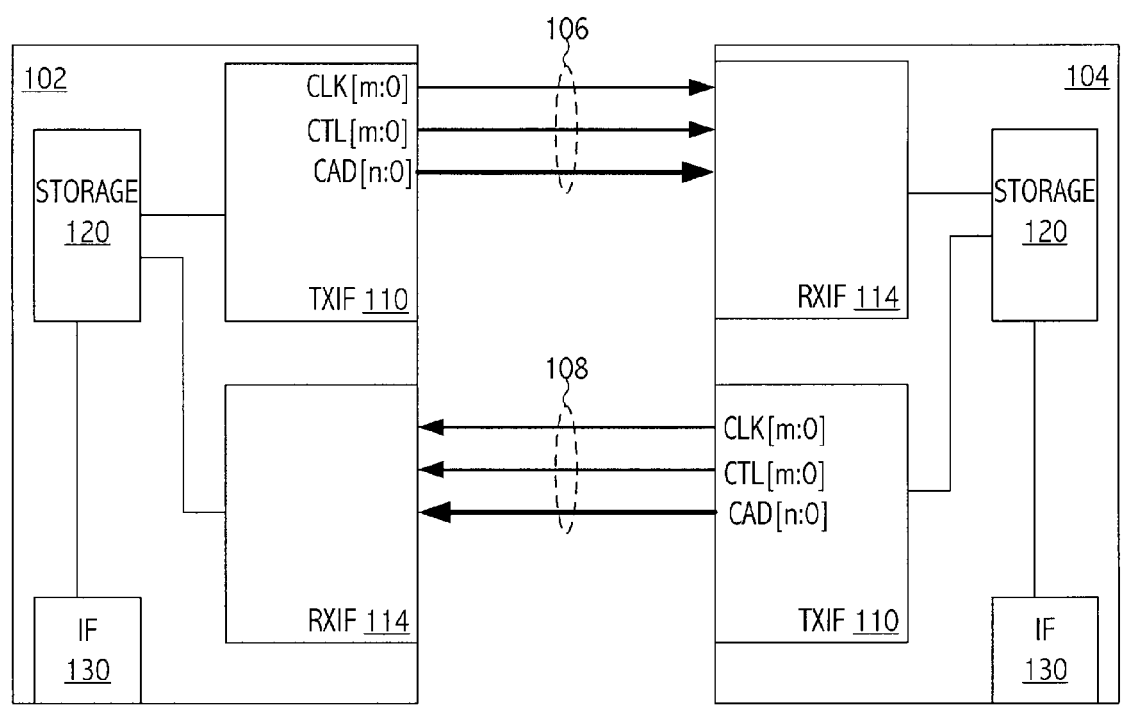
FIG. 1 illustrates a block diagram of two integrated circuit devices coupled by a communications link consistent with one or more embodiments of the present invention.

Referring to FIG. 1, integrated circuit 102 communicates with integrated circuit 104 by an exemplary communications link including transmit interfaces 110, receive interfaces 114, and communications paths 106 and 108, which include respective, individual communications paths for clock signals (e.g., CLK[m:0]), control signals (e.g., CTL[m:0]), and data signals (e.g., n-bits of commands, addresses, or data, i.e., CAD[n:0]). Those individual communications paths may be single-ended or differential communications paths. In at least one embodiment of the communications link, a bit-time is half of a clock period in duration, i.e., two data bits (e.g., two CAD[n:0] bits or two CTL[m:0] bits) are transmitted on a corresponding communications path per clock cycle (e.g., a period of a respective one of CLK[m:0]). However, the teachings herein may be adapted for bit-times having one clock period in duration (i.e., one data bit is transmitted on a corresponding communications path per clock cycle) or for other suitable bit-time durations. Communications paths 106 and 108 are unidirectional, i.e., communications paths 106 provide paths from integrated circuit 102 to integrated circuit 104 and communications paths 108 provide paths to integrated circuit 102 from integrated circuit 104. Integrated circuit 102 may include a sideband control mechanism (e.g., interface 130) that provides access to control and/or status registers internal to integrated circuit 102 (e.g., locations in storage circuit 120). Interface 130 may be a Joint Test Action Group (i.e., JTAG) interface, System Management Bus (i.e., SMBus) interface, or other suitable interface. In at least one embodiment, interface 130 communicates test, characterization, and/or diagnostic information between the corresponding integrated circuit and an external processing device (not shown).

Figure 2:
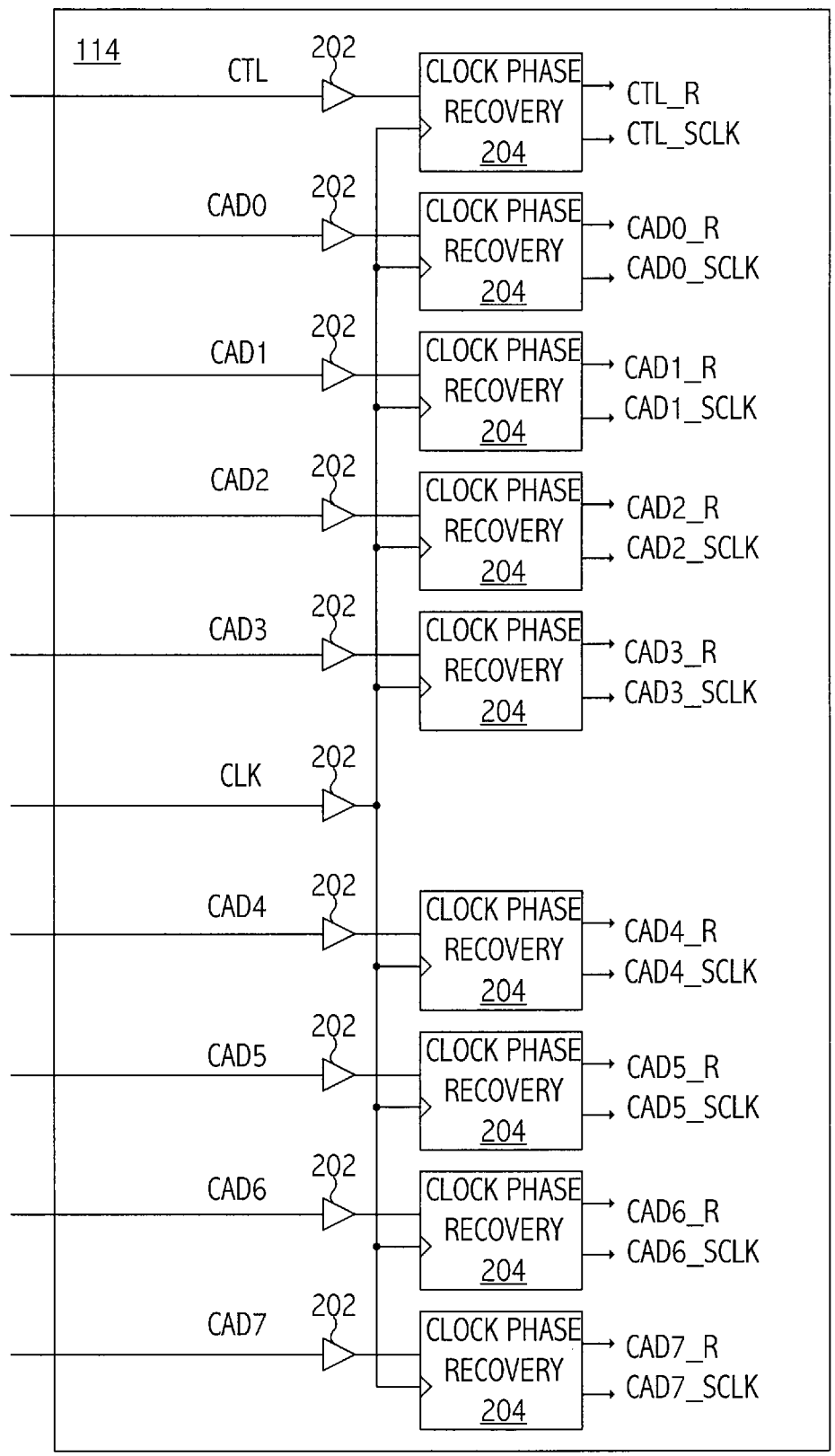
FIG. 2 illustrates a block diagram of a portion of a communications link receive path on an integrated circuit device consistent with one or more embodiments of the present invention.

Referring to FIG. 2, exemplary signals on individual communications paths, CLK, CTL, and CAD[7:0] are received by individual receivers 202 and individual clock phase recovery circuits 204 in receive interface 114 of integrated circuit 104. During data communications operations, receivers 202 may perform signal equalization, signal level shifting, noise reduction, or other appropriate signal processing functions. Exemplary clock phase recovery circuits 204 individually receive a received clock signal (e.g., CLK) in addition to a respective, received data signal (e.g., CTL, CAD0, CAD1, . . . , CAD7). Clock phase recovery circuits 204 generate corresponding sample clocks (e.g., CTL_SCLK, CAD0_SCLK, CAD1_SCLK, . . . , CAD7_SCLK) and provide the recovered data (e.g., CTL_R, CAD1_R, CAD2_R, . . . CAD7_R) to other circuitry of receive interface 114. An individual sample clock signal (e.g., CAD4_SCLK) is a dynamically delayed version of the received clock signal (e.g., CLK), which is dynamically delayed based at least in part on a phase difference between the received clock signal and the corresponding received data signal (e.g., CAD4).

In at least one embodiment of receive interface 114, individual ones of clock phase recovery circuits 204 generate a sample clock signal for sampling the received data signal at the center of a data eye of the received data signal. The phase difference between the received clock signal and the received data signal may be non-stationary, i.e., this phase difference varies during a period of communications link operation. Thus, the delay applied to the received clock signal to generate the sample clock signal is adjusted during the period of communications link operation, accordingly. In at least one embodiment of clock phase recovery circuits 204, the phase difference between the received clock signal and the received data signal at the receiver is less than a particular transport phase difference threshold value (e.g., 3 unit intervals or bit-times). However, in other embodiments of clock phase recovery circuits 204, the phase difference between the sample clock signal and the received data signal may be greater than that particular transport phase difference threshold value.

Figure 3:
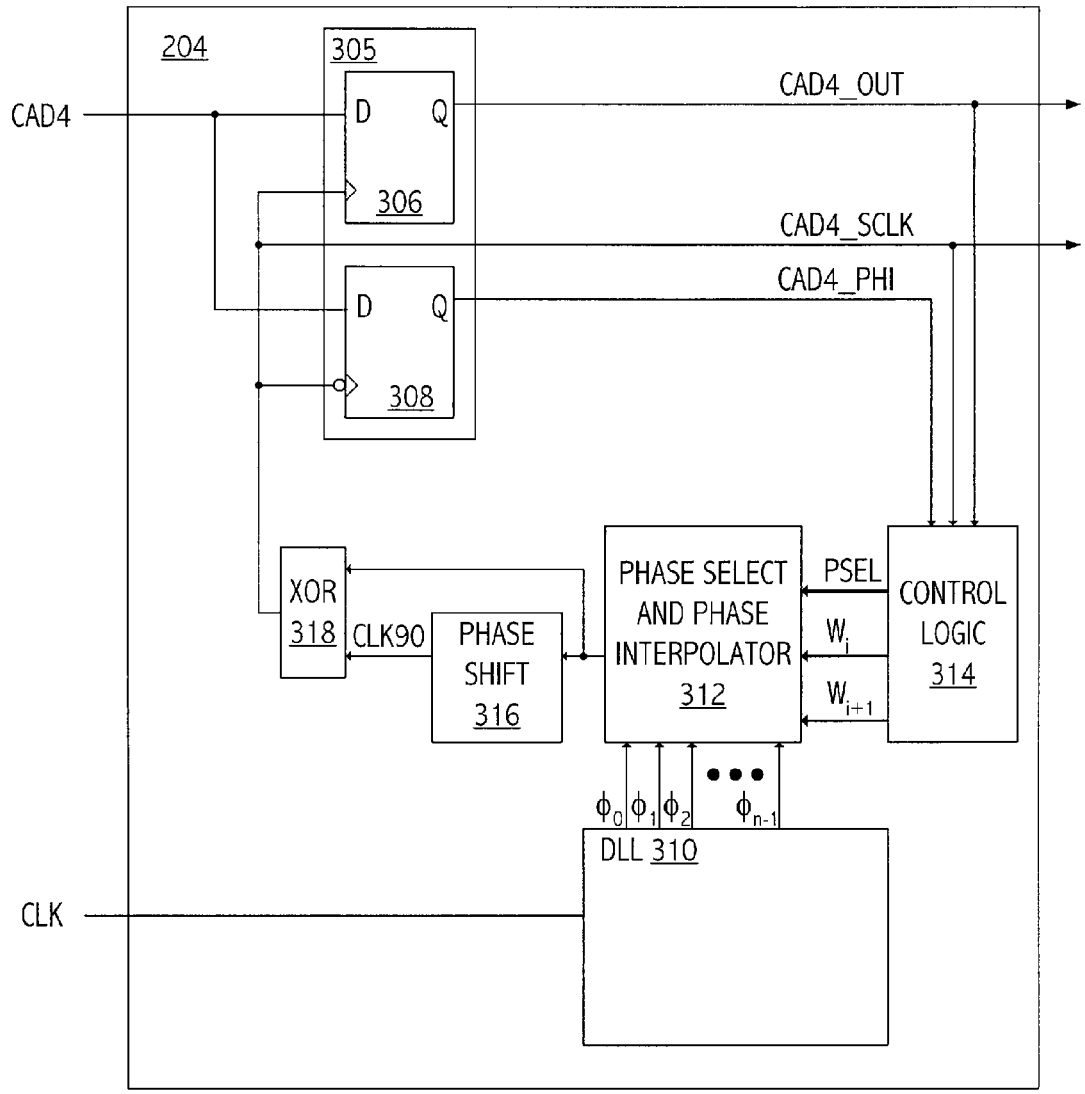
FIG. 3 illustrates a block diagram of an exemplary clock phase recovery circuit consistent with one or more embodiments of the present invention.

Referring to FIG. 3, an exemplary clock phase recovery circuit (e.g., clock phase recovery circuit 204) recovers phase information from the received data signal (e.g., CAD4) and the received clock signal (e.g., CLK) to generate a sample clock signal (e.g., CAD4_SCLK) and a sampled data signal (CAD4_OUT). In at least one embodiment, phase detector 305 includes two flip-flops (e.g., flip-flop 306 and flip-flop 308) that sample the received data signal based on the sample clock signal (e.g., CAD4_SCLK) 180° out of phase with each other. Phase detector 305 provides two signals, a sampled received data signal and a signal providing phase information, e.g., CAD4_OUT and CAD4_PHI, respectively. Those signals are indicative of the phase difference between the received data signal and the received clock signal and are provided to control logic circuit 314.

Figure 6:
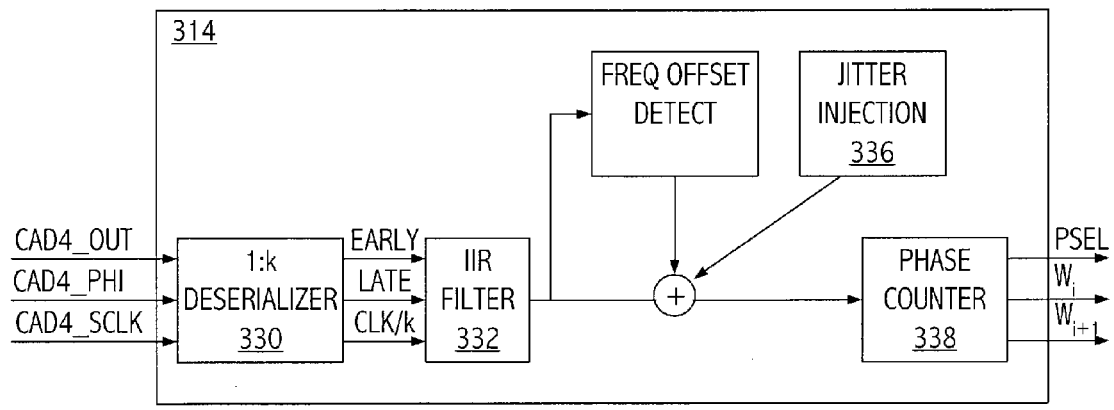
FIG. 6 illustrates a block diagram of an exemplary control logic circuit of a clock phase recovery circuit of FIG. 3 consistent with one or more embodiments of the present invention.

During data communications operations, control logic circuit 314 generates digital control signals (e.g., PSEL, $W_i$, and $W_{i+1}$) for adjusting the sample clock signal based, at least in part, on a comparison of CAD4_OUT to CAD4_PHI. Control logic circuit 314 controls a phase selection and phase interpolation circuit, (e.g., phase select and phase interpolation circuit 312) to generate the sample clock signal having a target phase relationship to the received data signal. For example, control logic circuit 314 may generate control signals PSEL, $W_i$, and $W_{i+1}$ to apply an appropriate delay to the received clock signal to generate the sample clock signal to sample the received data signal in substantially the center of the data eye. Referring to FIG. 6, in an exemplary control logic circuit 314, deserializer circuit 330 determines whether the phase of the sample clock signal is early or late with respect to the received data signal and generates a corresponding phase change request (e.g., phase counter 338 provides appropriate values of PSEL, $W_i$, and $W_{i+1}$) based on this determination. The phase change request applies a delay to shift the phase of the sample clock signal to shift the phase of the sample clock signal in a direction that aligns the sample clock signal with an appropriate phase of the data signal. Note that the relationship between phase (φ, in degrees) and delay ($t_D$, in seconds) is φ=360×$t_D$×f (where frequency, f, is measured in Hz). In at least one embodiment of control logic circuit 314, digital circuitry included in control logic circuit 314 is responsive to a clock derived from the sample clock signal (e.g., CLK/k, a frequency divided version of CLK generated by deserializer circuit 330). However, other clock signals of suitable frequency may be used by control logic circuit 314.

Figure 4:
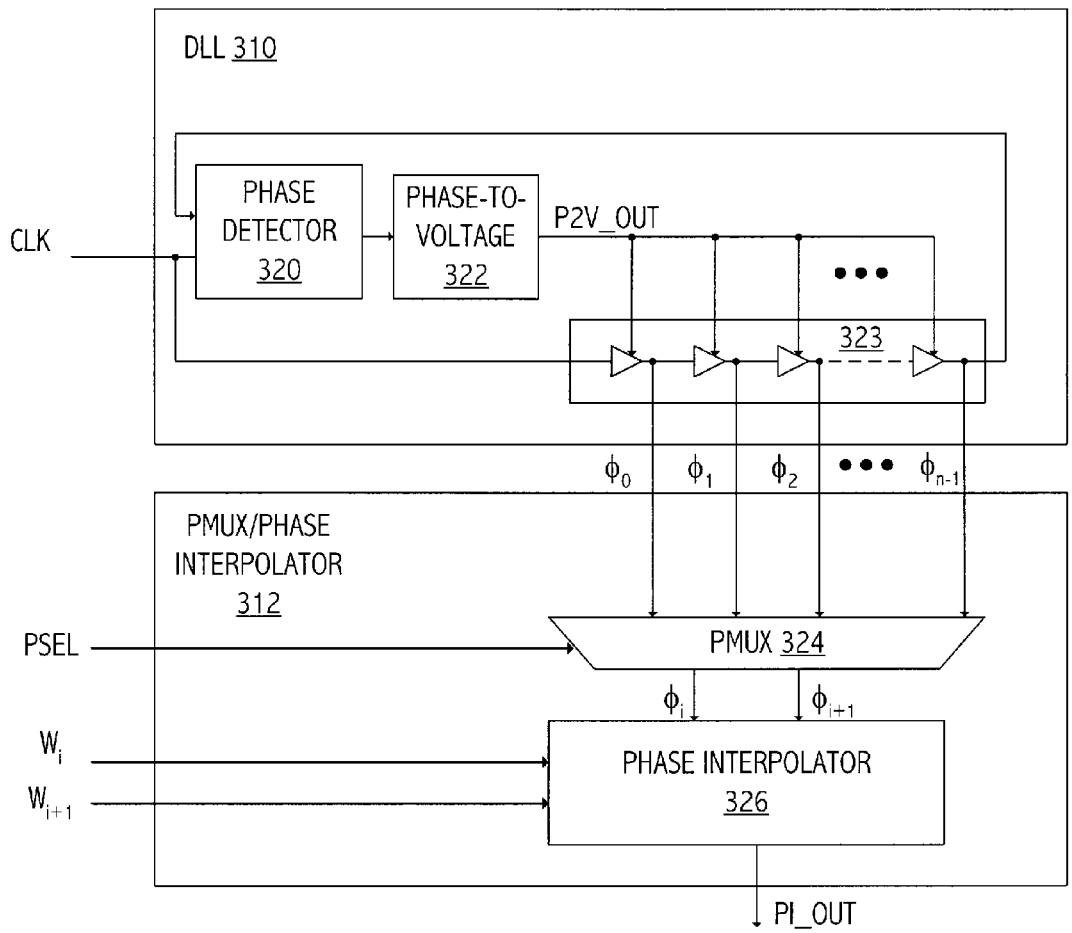
FIG. 4 illustrates a block diagram of an exemplary portion of the clock phase recovery circuit of FIG. 3 consistent with one or more embodiments of the present invention.

Referring back to FIG. 3, in addition to receiving control signals from control logic circuit 314, phase select and phase interpolation circuit 312 receives n phase signals from delay-locked loop (DLL) 310 (e.g., $\phi_0$, $\phi_1$, . . . , $\phi_{n-1}$), which generates these signals based on the received clock signal. Referring to FIG. 4, in at least one embodiment of clock phase recovery circuit 204, DLL 310 includes a delay line (e.g., delay line 323) that is configured to have a total delay equal to the period of the received clock signal. Phase signals $\phi_0$, $\phi_1$, . . . , $\phi_{n-1}$ are spaced evenly to cover the 360° phase space of the received clock signal. Phase signals $\phi_0$, $\phi_1$, . . . , $\phi_{n-1}$ are versions of the received clock signal delayed by equivalent increments from next adjacent phase signals. Those phase signals may be generated by tapping off appropriate nodes of the delay line. In an exemplary DLL 310, DLL 310 locks at the 180° point of the received clock signal, which is a half-rate clock signal (e.g., approximately 2.6 GHz at an approximately 5.2 Gbps data rate) to provide a total delay that is equal to one unit interval or bit-time (e.g., approximately 192 ps for an approximately 2.6 GHz received clock signal). In at least one embodiment, of DLL 310, phase signals $\phi_0$, $\phi_1$, . . . , $\phi_{n-1}$ include n/2 true phase signals (e.g., $\phi_0$, $\phi_1$, . . . , $\phi_{n/2-1}$) and corresponding n/2 complementary phase signals (e.g., $\phi_B$, $\phi_{1B}$, . . . , $\phi_{(n/2-1)B}$) in implementations of clock phase recovery circuit 204 that include complementary delay lines in DLL 310, as discussed below.

Delay-locked loop 310 includes a feedback loop including phase detector 320, which may be any suitable phase detector that compares the received clock signal to a delayed version of the received clock signal to generate a phase difference signal. That phase difference is applied to delay line 323 in a way that achieves a cumulative delay of delay line 323 that is equal to a period of the received clock signal or a predetermined portion of a period of the received clock signal. For example, delay line 323 may be a voltage-controlled delay line. The phase difference output of phase detector 320 may be converted by phase-to-voltage circuit 322 into a voltage (e.g., P2V_OUT) that is applied to delay line 323 to adjust the delay of individual delay elements of the delay line to be equivalent and to have a duration that provides a cumulative delay of the delay line equal to the period of the received clock signal. In at least one embodiment of phase-to-voltage converter circuit 322, the phase-to-voltage conversion is performed by a charge pump. In at least one embodiment of phase detector 320, a binary phase detector or bang-bang type phase detector is used, providing a digital output signal of '1' or '0,' indicating a respective one of an early or late relationship between the received clock signal and the delayed version of the received clock signal. Phase-to-voltage circuit 322 receives the digital output signal and integrates the signal using, e.g., a digital counter that increments in response to an early indication and decrements in response to a late indication. The counter output may be converted into a voltage by a digital-to-analog converter circuit and provided to a smoothing filter to generate an output voltage signal indicating the phase difference. In at least one embodiment of DLL 310, delay line 323 is a current-controlled delay line and the phase difference is converted by an appropriate circuit, accordingly.

In an exemplary embodiment of clock phase recovery circuit 204, DLL 310 includes two complementary delay lines driven by complementary versions of the received clock signal. The two complementary delay lines are tapped after each inverter of the delay lines to provide phase-adjacent signals separated by only one inverter delay, thereby improving phase resolution by a factor of two of the individual delay lines. In such an exemplary DLL 310, DLL 310 locks at the 180° point of the received clock signal, which is a half-rate clock signal (e.g., approximately 2.6 GHz at a 5.2 Gbps data rate) to provide a delay of the individual ones of the complementary delay lines that is equal to one unit interval or bit-time (e.g., approximately 192.3 ps for a 2.6 GHz received clock signal). Delay-locked loop 310 outputs true taps from delay line 323 (e.g., $\phi_0, \phi_1, \ldots, \phi_5$), which provide the first 180° of phase signals. In addition, DLL 310 outputs complement taps (e.g., $\phi_{0B}, \phi_{1B}, \ldots, \phi_{5B}$), which provide the second 180° of phase signals. Those twelve phase signals cover the 360° of phase with 30° of separation between adjacent phases, each phase signal providing an exemplary delay of $(30°/360°) \times (1/2.6 \text{ GHz}) = 32.05$ ps.

Figure 7:
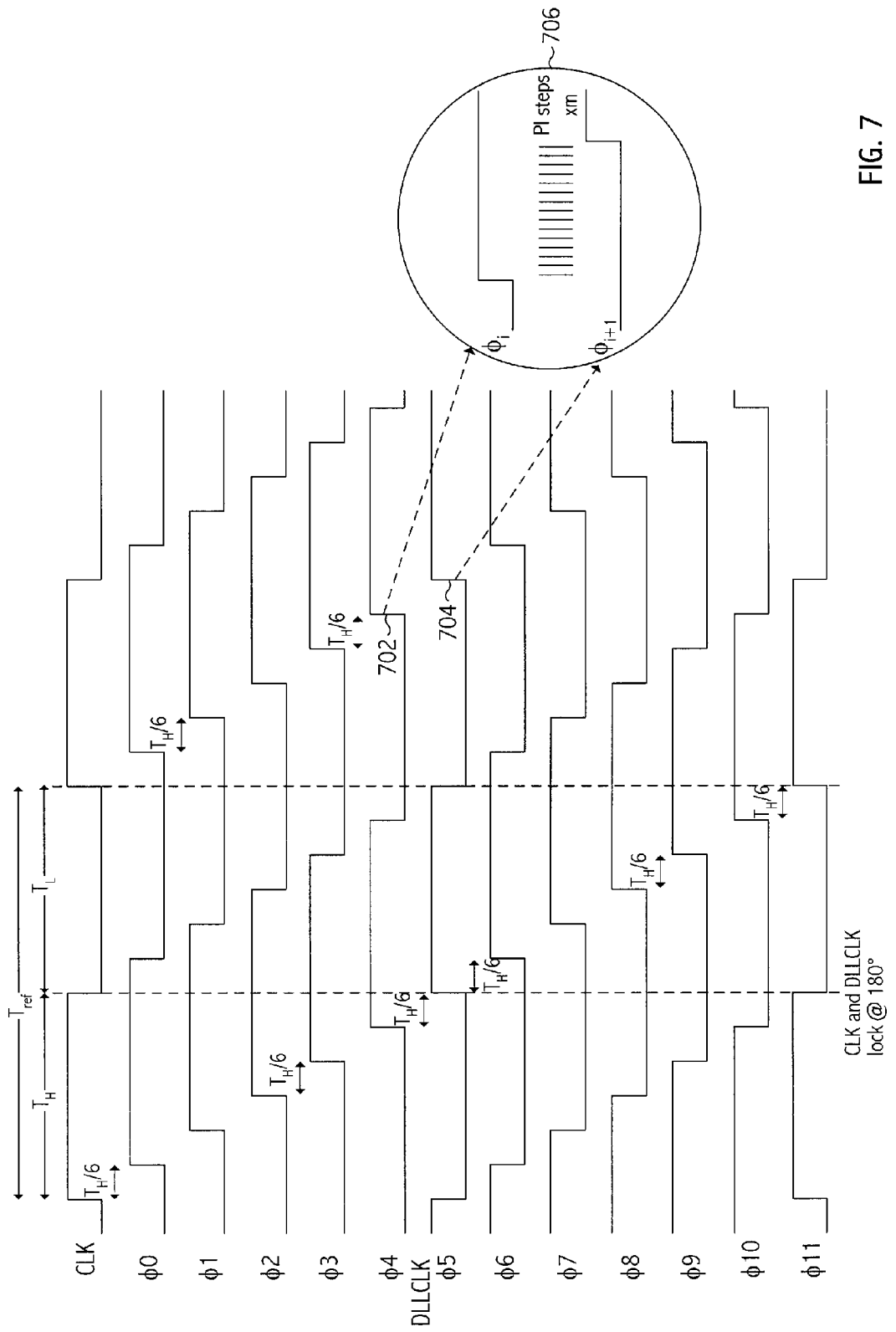
FIG. 7 illustrates a timing diagram of exemplary waveforms consistent with the portion of the clock phase recovery circuit of FIG. 4.

Referring to FIGS. 4 and 7, since DLL 310 outputs only discrete values and the phase difference between the received clock signal and the received data signal may not be exactly one of these discrete values, phase select and phase interpolation circuit 312 selects (e.g., according to PSEL) two adjacent phase signals that have phases with respect to the received clock signal that are nearest to the phase difference to be applied to the received clock signal for use in generating the sample clock signal. Those two adjacent phase signals (e.g., $\phi_i$ and $\phi_{i+1}$) are received by phase interpolation circuit 326 and a phase interpolation of the two adjacent phase signals may be performed to generate an interpolated clock signal (e.g., PI_OUT) that is used to generate the sample clock signal. Phase interpolation circuit 326 may be any suitable phase interpolation circuit. Phase interpolator designs are well known in the art and are typically dependent upon the particular DLL implementation and electrical parameters of the interface in which they operate.

The phase difference between the received clock signal and the received data signal may not fall exactly between the selected adjacent phase signals and phase interpolator 326 may not apply an equal weight to each of the adjacent phase signals. Rather, phase interpolator 326 may receive control signals (e.g., weighting signals $W_i$ and $W_{i+1}$) generated by control logic circuit 314 that indicate an appropriate weighting function for application to phase signals $\phi_i$ and $\phi_{i+1}$ to generate the signal having an intermediate phase, e.g., PI_OUT. Accordingly, PI_OUT is an interpolated version of $\phi_i$ and $\phi_{i+1}$ having a particular phase relationship with the received data signal and is used to generate the sample clock signal, which may be phase aligned with the center of the data eye of the received data signal.

In at least one embodiment, DLL 310 provides only exemplary discrete values 0°, 30°, 60°, 90°, 120°, ..., 330° phase shift signals. In at least one embodiment of phase interpolation circuit 326, weighting signals $W_i$ and $W_{i+1}$ are four bits wide, i.e., each of the phase signals $\phi_i$ and $\phi_{i+1}$ may be weighted by one of sixteen different values, to obtain a signal having one of sixteen different phases in between the phases of $\phi_i$ and $\phi_{i+1}$, as illustrated in detail 706 of FIG. 7 by m (e.g., m=16) equally spaced phase steps between transition 702 of signal $\phi_4$ and transition 704 of $\phi_5$. For example, to obtain a phase shift of approximately 157.5°, which is between the discrete phase shifts of 150° and 180°, control logic circuit 314 provides a value for $W_i$ that weights $\phi_4$ by 4/16 and a value for $W_{i+1}$ that weights $\phi_5$ by 12/16 (e.g., $(150° \times 12/16) + (180° \times 4/16) = 157.5°$).

Figure 8:
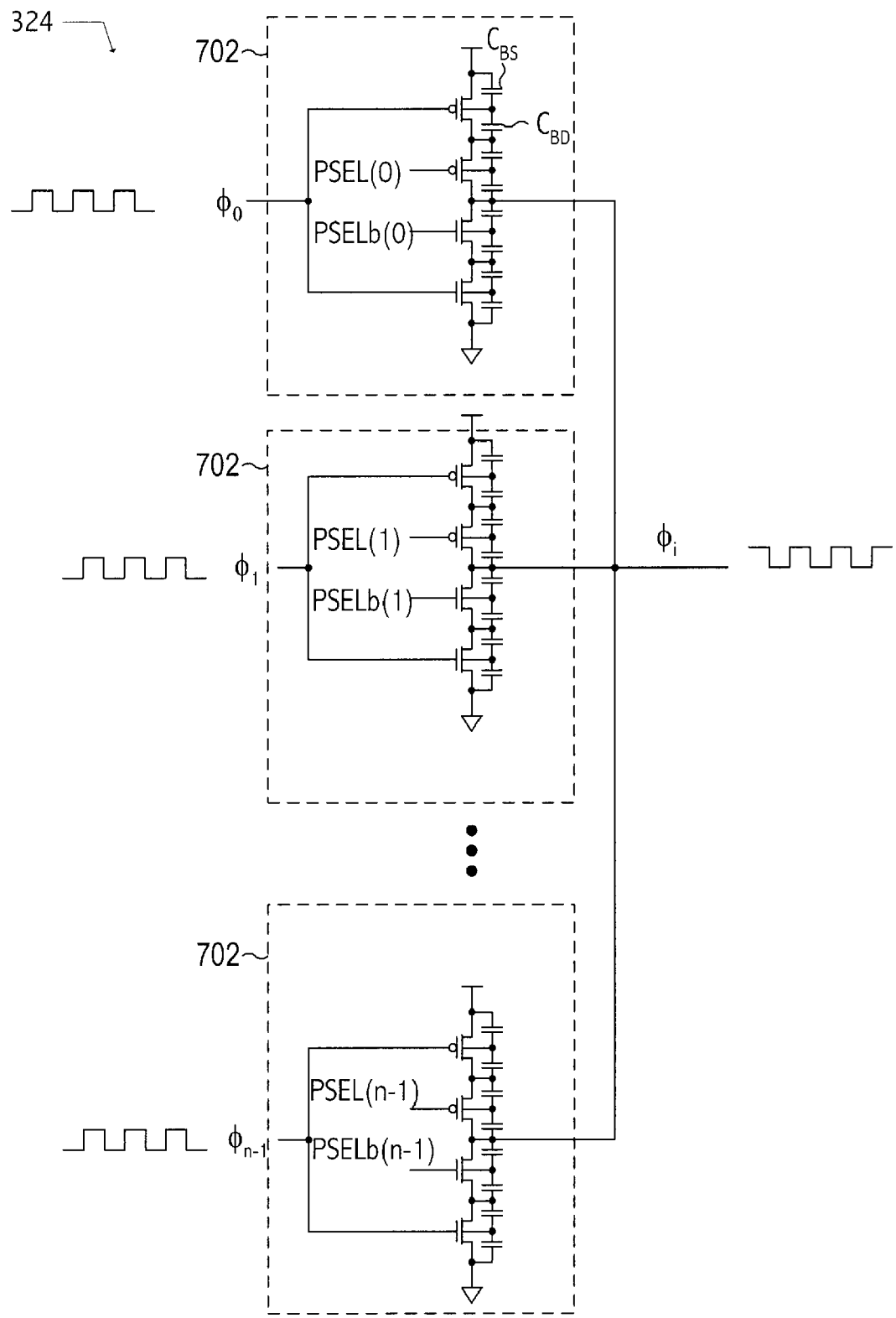
FIG. 8 illustrates a circuit diagram of an exemplary select circuit of the clock phase recovery circuit of FIG. 4.

Referring back to FIG. 4, phase select and phase interpolation circuit 312 includes phase select circuit 324. In at least one embodiment, phase select circuit 324 includes a plurality of tri-state inverters, as illustrated in FIG. 8. The plurality of tri-state inverters provides one of the phase signals (e.g., phase signals $\phi_0, \phi_1, \ldots, \phi_{n-1}$) to an output node (e.g., $\phi_i$) according to a select signal (e.g., PSEL). An exemplary PSEL signal is one-hot encoded, i.e., only one of the tri-state inverter circuits 702 drives a signal on the output node, while others of the tri-state inverter circuits 702 are configured in a high-impedance state (i.e., the others of the tri-state inverter circuits 702 do not couple node $\phi_i$ to an established potential).

In at least one embodiment, phase select circuit 324 is formed, for example, in a silicon-on-insulator (i.e., SOI) technology or other technology where the bulk (i.e., body) terminals of devices are not easily coupled to a fixed potential (e.g., $V_{DD}$ for PMOS devices and $V_{SS}$ for NMOS devices). As a result, the voltage on the bulk terminals of tri-state inverter circuits 702 drift towards $V_{DD}$ or $V_{SS}$, thereby introducing hysteresis into tri-state inverter circuits 702. That is, the response of an individual tri-state inverter circuit 702 is based on respective present values of PSEL and $\phi_i$ and on respective past values of PSEL and $\phi_i$. The drift in the voltage on the bulk terminal causes a shift in the threshold voltage (i.e., $V_{TN}$ or $V_{TP}$) of a particular device. Accordingly, tri-state inverter circuits 702 or other circuits implemented in phase select circuit 324 may experience a change in circuit delay. For example, tri-state inverter circuits 702 may experience a greater initial delay (e.g., 10-20 percent greater than a nominal delay value) when a previously deselected tri-state inverter circuit 702 is later selected.

Variations in the delay of phase select circuit from a nominal delay value can result in inaccuracies in one or both of the phases of phase signals $\phi_i$ and $\phi_{i+1}$ and inaccuracies in the phase of the clock signal generated by interpolating between those two phase signals (e.g., PI_OUT). Inaccuracies in the phase of the interpolated clock signal, which is used to generate the sample clock signal, may be more pronounced when the target phase relationship between the sample clock signal and the received data signal is close to a phase boundary. Those inaccuracies may result in a phase relationship of between the sample clock signal and the received data signal that varies from the target phase relationship. That misalignment of the phase of the sample clock signal from the target phase relationship may increase a system bit error rate (BER).

Figure 9:
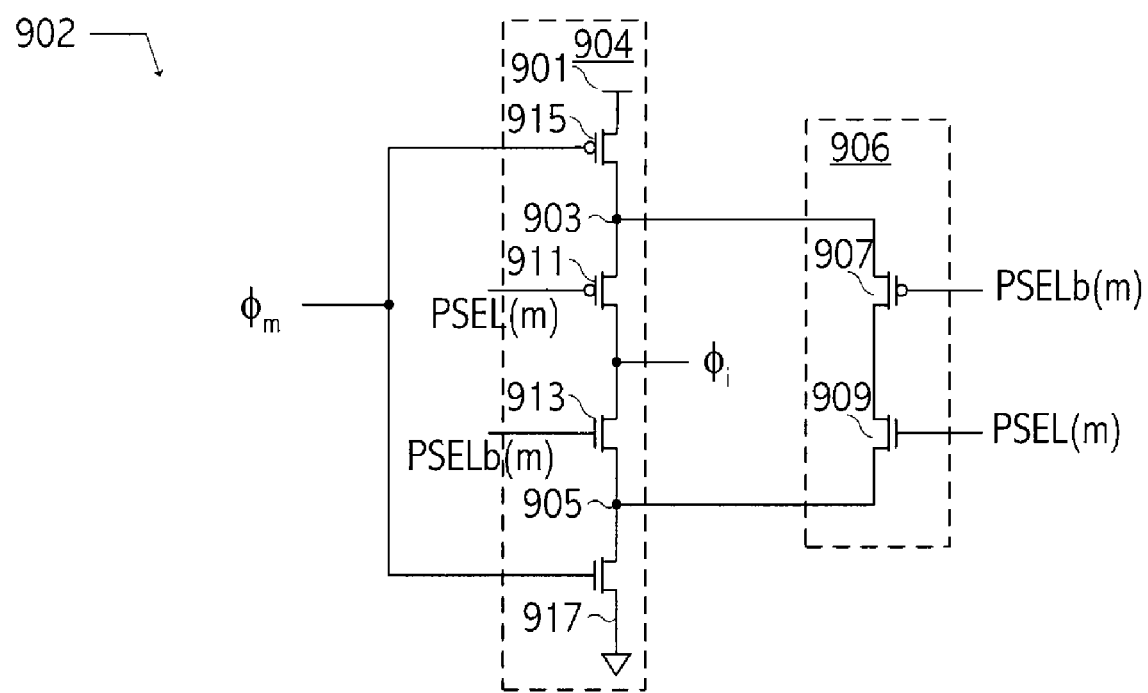
FIG. 9 illustrates a circuit diagram of an exemplary select circuit of the clock phase recovery circuit of FIG. 3 consistent with one or more embodiments of the present invention.

Referring to FIG. 9, in at least one embodiment, phase select circuit 324 includes at least one select circuit 902, which includes a tri-state inverter portion (e.g., tri-state inverter circuit 904) and a supporting path (e.g., supporting path 906). In at least one embodiment of select circuit 902, tri-state inverter circuit 904 and supporting path 906 are effectively enabled during different states of a select signal (e.g., PSEL(m)). The supporting path is effectively disabled when the tri-state inverter circuit is effectively enabled, e.g., select signal PSEL(m)='0' and PSELb(m)='1'. For example, both p-type device 909 and n-type device 907 are effectively disabled, i.e., no substantial current flows through the circuit path from node 903 through device 907 and device 909 and into node 905. Meanwhile, a version of $\phi_m$ is transferred to node $\phi_i$ by tri-state inverter circuit 904. For example, when effectively enabled (e.g., select signal PSEL(m)='0' and PSELb(m)='1'), p-type device 911 and n-type device 913 are effectively enabled. Node $\phi_i$ is charged to a high value by a path to VDD via p-type devices 915 and 911 when $\phi_m$='1.' Node $\phi_i$ is charged to a low voltage (i.e., $\phi_i$='0') by a path to ground via n-type devices 913 and 917 when $\phi_m$ has a low voltage (i.e., $\phi_i$='0').

The supporting path is effectively enabled when the tri-state inverter circuit is effectively disabled, e.g., select signal PSEL(m)='1' and PSELb(m)='0'. Tri-state inverter circuit 904 is in a high-impedance state, i.e., tri-state inverter circuit 904 does not effectively couple node $\phi_i$ to an established potential (e.g., to $V_{DD}$ or to ground). In at least one embodiment of supporting path 906, devices 907 and 909 are "weak" devices, i.e., device 907 has a strength substantially less than the strength of device 911 or device 915 and device 909 has a strength substantially less than the strength of device 913 or 917. For example, in at least one embodiment of supporting path 906, the strength of device 911 is at least two times greater than the strength of device 907 and the strength of device 913 is at least two times greater than the strength of device 909. However, other strength ratios may be used. For example, different strength ratios may be selected based on a tradeoff between power consumption and speed, a particular target manufacturing process technology, and/or power supply voltage levels of an integrated circuit including a supporting path consistent with the invention.

When effectively enabled, supporting path 906 toggles nodes 903 and 905 in response to the signal on node $\phi_m$. By toggling the voltages on nodes 903 and 905, the voltage of the body terminal of devices 915 and 917 are maintained at respective equilibrium voltages, which may be process dependent, thereby maintaining respective device threshold voltages at substantially constant voltages, regardless of the value of PSEL(m). Thus, supporting path 906 reduces the effect of history-dependent delay of tri-state inverter circuit 904 on the response of select circuit 902. For example, the delay through a particular select circuit 902, when previously deselected, is substantially closer to the delay through that particular select circuit 902, when previously selected, as compared to those delays through another select circuit not including a supporting path.

Note that although select circuit 902 provides an inverted version of the selected output, the invention is not limited thereto. For example, rather than including tri-state inverter circuit 904, in at least one embodiment, select circuit 902 includes a non-inverting select circuit coupled to a supporting path consistent with the non-inverting function. In addition, select circuit 902 may operate with voltages consistent with a voltage supplied to receive interface 114 or a voltage generated internally to receive interface 114 by a regulated voltage supply node (e.g., P2V_OUT).

Figure 5:
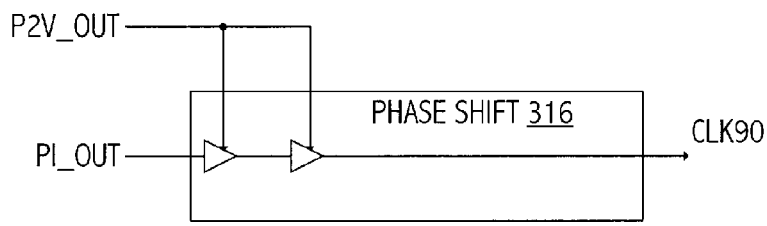
FIG. 5 illustrates a block diagram of an exemplary phase shifting circuit of a clock phase recovery circuit of FIG. 3 consistent with one or more embodiments of the present invention.

Referring back to FIG. 3, the sample clock may be generated by an exclusive- or (e.g., as applied by XOR 318) of the intermediate phase signal (e.g., PI_OUT) with a phase-shifted version of the intermediate phase signal. For example, the intermediate phase signal is a phase-shifted version of the received clock signal and, thus, is a half-rate clock signal (e.g., approximately 2.6 GHz at a 5.2 Gbps data rate). A full-rate clock signal (e.g., approximately 5.2 GHz at a 5.2 Gbps data rate) is generated by exclusive-oring the intermediate phase signal with a version of the intermediate phase signal that is phase shifted by 90°. Referring to FIG. 5, an appropriate phase shift (e.g., a 90° phase shift) is generated by including within exemplary phase shift circuit 316, an appropriate fraction of the number of delay elements in the delay line 323 of DLL 310. The delay elements in phase shift circuit 316 are adjusted by the voltage generated by phase-to-voltage circuit 322 (e.g., P2V_OUT) that is applied to delay line 323 to adjust the delay of individual delay elements of delay line 323 to be equivalent and to have a duration that provides a total delay of the delay line equal to an appropriate period of the received clock signal. In at least one embodiment of the invention, P2V_OUT is applied to phase shift circuit 316 to provide a 90° phase shift. Referring back to FIG. 3, the signal generated by XOR 318 is the sample clock signal that is used to sample the received data signal. One edge of the sample clock signal (i.e., a rising or a falling edge) is aligned with transitions in the received data signal. The other edge of the sample clock signal is half of a unit interval away from the data edge, which is generally in the center of the data eye and is used to sample the received data signal. Note that since transmit clock jitter is present in both the received data signal and the received clock signal, the transmit clock jitter is effectively a common mode phase variation that is rejected by clock phase recovery circuit 204.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which the received data signals have bit-times of half the received clock period in duration, one of skill in the art will appreciate that the teachings herein can be utilized with received data signals having other bit-times and receiver interfaces operating consistent with other clock and data recovery techniques. Variations and modifications of the embodiments disclosed herein, may be made based on the description set forth herein, without departing from the scope and spirit of the invention as set forth in the following claims.

What is claimed is:

1. An apparatus comprising:
   at least one input node responsive to a respective one of at least one input signal;
   at least one circuit coupled to a respective one of the at least one input node and coupled to an output node, individual ones of the at least one circuit being configured to provide a version of the respective input signal to the output node in response to a first state of a respective select signal; and
   at least one second circuit coupled to a respective one of the at least one circuit, the at least one second circuit being configured to toggle nodes of the at least one circuit in response to a second state of the respective select signal.

2. The apparatus, as recited in claim 1, wherein the at least one second circuit toggles the nodes of the at least one circuit according to the respective input signal.

3. The apparatus, as recited in claim 1, wherein the at least one circuit comprises at least one device comprising a floating bulk terminal.

4. The apparatus, as recited in claim 1, wherein the at least one circuit comprises a plurality of tri-state inverter circuits.

5. The apparatus, as recited in claim 1, wherein the at least one circuit is configured to provide to the output node one of a plurality of delayed versions of a clock signal, the delayed versions being delayed by equivalent amounts from respective next adjacent phase signals.

6. The apparatus, as recited in claim 1, wherein the at least one circuit comprises:
   a first device of a first conductivity type coupled between a power supply node and a first node, the first device being responsive to a respective input signal;
   at least a second device of a second conductivity type coupled between a ground node and a second node, the second device being responsive to the respective input signal; and
   wherein the at least one second circuit is coupled to the first node and coupled to the second node.

7. The apparatus, as recited in claim 6, wherein the at least one circuit further comprises:
   a third device of the first conductivity type, coupled to a respective select signal, the first node, and the output node; and
   a fourth device of the second conductivity type, coupled to a complement of the respective select signal, the third device, the second node and the output node.

8. The apparatus, as recited in claim 7, wherein the at least one second circuit comprises:
   a fifth device of the first conductivity type, coupled to the first node and coupled to a third node, the fifth device being responsive to the complement of the respective select signal; and
   a sixth device of the second conductivity type, coupled to the second node and the third node, and responsive to the respective select signal.

9. The apparatus, as recited in claim 6, wherein the power supply node is a regulated power supply node.

10. The apparatus, as recited in claim 6, wherein the at least one second circuit comprises at least one device, the at least one device of the second circuit having a strength ratio at least 2:1 to at least one device of the first circuit.

11. The apparatus, as recited in claim 1, wherein the circuits are formed in a silicon-on-insulator process technology.

12. A method comprising:
   effectively enabling a first path to provide to an output node, a version of an input clock signal in response to a first state of at least one select signal and effectively disabling the first path otherwise; and
   effectively enabling a second path to toggle at least one intermediate node within the first path while the first path is effectively disabled and effectively disabling the second path otherwise, the second path being responsive to the version of the input clock signal.

13. The method, as recited in claim 12, wherein the at least one intermediate node is toggled according to the version of the input clock signal.

14. The method, as recited in claim 12, wherein the first path comprises a tri-state inverter circuit.

15. The method, as recited in claim 12, wherein the first path comprises at least one device with a floating bulk terminal.

16. The method, as recited in claim 15, wherein the second path comprises at least one device that has a strength ratio of at least 2:1 to at least one device in the first path.

17. The method, as recited in claim 12, further comprising:
   providing to the output node, one of a plurality of delayed versions of a clock signal, the delayed versions being delayed by equivalent amounts from respective next adjacent phase signals, wherein the providing comprises the effectively enabling of the first path and the effectively enabling of the second path.

18. The method, as recited in claim 12, wherein the input signal is one of a plurality of versions of a periodic signal having different phases.

19. The method, as recited in claim 12, wherein the first and second paths are formed in a silicon-on-insulator process.

20. An apparatus comprising:
   means for selectively transferring a version of an input clock signal to an output node based, at least in part, on an indication of selection of the version of the input clock signal and for impeding the transfer of the version of the input clock signal otherwise; and
   means for toggling internal nodes of the means for selectively transferring while the means for selectively transferring impedes the transfer of the version of the input clock signal.

21. The apparatus, as recited in claim 20, wherein the means for transferring comprises at least one device including a floating bulk terminal.

22. The apparatus, as recited in claim 20, wherein the means for toggling comprises at least one device that has a strength ratio of at least 2:1 to at least one device in the means for transferring.

23. The apparatus, as recited in claim 20, wherein the input clock signal is one of a plurality of delayed versions of a reference clock signal, the delayed versions being delayed by equivalent amounts from respective next adjacent phase signals.

* * * * *